(12) United States Patent
Huang

(10) Patent No.: US 10,601,195 B2
(45) Date of Patent: Mar. 24, 2020

(54) ELECTRICAL CONNECTOR AND ELECTRICAL CONNECTOR ASSEMBLY CAPABLE OF ENSURING TERMINAL POSITIONING EFFECT

(71) Applicant: LOTES CO., LTD, Keelung (TW)

(72) Inventor: Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 21 days.

(21) Appl. No.: 16/109,950

(22) Filed: Aug. 23, 2018

(65) Prior Publication Data
US 2020/0036148 A1    Jan. 30, 2020

(30) Foreign Application Priority Data

Jul. 30, 2018  (CN) .................... 2018 2 1212199 U

(51) Int. Cl.
| | |
|---|---|
| H01R 11/22 | (2006.01) |
| H01R 13/11 | (2006.01) |
| H01R 13/10 | (2006.01) |
| H01R 33/00 | (2006.01) |
| H01R 43/02 | (2006.01) |
| H01R 13/115 | (2006.01) |
| H01R 13/405 | (2006.01) |
| H01R 12/70 | (2011.01) |

(Continued)

(52) U.S. Cl.
CPC ....... *H01R 43/0263* (2013.01); *H01R 12/707* (2013.01); *H01R 12/716* (2013.01); *H01R 13/04* (2013.01); *H01R 13/115* (2013.01); *H01R 13/405* (2013.01); *H01R 13/50* (2013.01); *H01R 43/0235* (2013.01); *H01R 13/631* (2013.01)

(58) Field of Classification Search
CPC ...... H01R 13/112; H01R 13/113; H01R 13/11
USPC .................................. 439/857, 682
See application file for complete search history.

(56) References Cited

U.S. PATENT DOCUMENTS

| | | | |
|---|---|---|---|
| 3,955,869 A | 5/1976 | Licht | |
| 4,997,385 A | * 3/1991 | Casagrande | ......... H01R 13/193 |
| | | | 439/259 |

(Continued)

FOREIGN PATENT DOCUMENTS

CN            202178412 U      3/2012

*Primary Examiner* — Abdullah A Riyami
*Assistant Examiner* — Thang H Nguyen
(74) *Attorney, Agent, or Firm* — Locke Lord LLP; Tim Tingkang Xia, Esq.

(57) ABSTRACT

An electrical connector includes: a body, provided with multiple accommodating holes penetrating through an upper surface and a lower surface of the body; multiple terminals, correspondingly accommodated in the accommodating holes; and multiple solders. Each accommodating hole has two opposite shielding portions. Each terminal includes a base, two extending portions bending and extending from two opposite sides of the base, two contact arms extending downward from the two extending portions and toward each other, and two clamping portions bending and extending from two opposite sides of a lower end of the base. An upper end of the base is exposed upward to a corresponding accommodating hole. The shielding portions shield upper ends of the extending portions. The two contact arms are used for a pin of a plug to insert downward therebetween. Each solder is correspondingly clamped by the two clamping portions.

20 Claims, 13 Drawing Sheets

(51) Int. Cl.
*H01R 13/50* (2006.01)
*H01R 13/04* (2006.01)
*H01R 12/71* (2011.01)
*H01R 13/631* (2006.01)

(56) References Cited

U.S. PATENT DOCUMENTS

| | | | | |
|---|---|---|---|---|
| 5,980,337 A * | 11/1999 | Little | H01R 13/11 | 439/857 |
| 6,224,432 B1 * | 5/2001 | Billman | H01R 13/112 | 439/856 |
| 6,247,954 B1 * | 6/2001 | Ju | H01R 12/89 | 439/342 |
| 6,471,534 B1 * | 10/2002 | Lee | H01R 13/193 | 439/342 |
| 6,482,023 B1 * | 11/2002 | Tan | H01R 13/193 | 439/342 |
| 6,533,590 B1 * | 3/2003 | Lee | H01R 4/027 | 439/83 |
| 6,533,591 B1 * | 3/2003 | Lee | H01R 12/57 | 439/83 |
| 6,565,368 B1 * | 5/2003 | Liao | H01R 13/112 | 439/342 |
| 6,638,119 B1 * | 10/2003 | Chang | H01R 13/112 | 439/342 |
| 6,843,662 B2 * | 1/2005 | Ju | H01R 43/0256 | 439/83 |
| 7,377,789 B1 * | 5/2008 | Liu | H01R 13/2442 | 439/66 |
| 7,699,638 B2 * | 4/2010 | Zhang | H05K 7/1084 | 439/342 |
| 7,771,244 B1 * | 8/2010 | Ju | H01R 4/022 | 439/342 |
| 7,878,870 B2 * | 2/2011 | Fan | H01R 12/57 | 439/71 |
| 8,052,436 B1 * | 11/2011 | Ju | H01R 12/57 | 439/342 |
| 8,177,574 B2 * | 5/2012 | Ju | H01R 24/00 | 439/342 |
| 8,197,262 B2 * | 6/2012 | Nguyen | H01R 12/57 | 439/74 |
| 8,221,172 B2 * | 7/2012 | Ju | H01R 13/111 | 439/342 |
| 8,360,790 B2 * | 1/2013 | Ju | H01R 12/716 | 439/66 |
| 8,708,716 B1 * | 4/2014 | Ho | H01R 12/714 | 439/83 |
| 10,084,252 B1 * | 9/2018 | Ju | H01R 12/712 | |
| 10,199,748 B2 * | 2/2019 | Ju | H05K 7/10 | |
| 2003/0186571 A1 * | 10/2003 | Lin | H01R 12/57 | 439/83 |
| 2003/0186576 A1 * | 10/2003 | Lin | H01R 13/112 | 439/342 |
| 2006/0094268 A1 * | 5/2006 | Hao | H01R 12/57 | 439/83 |
| 2006/0258190 A1 * | 11/2006 | Chen | H05K 3/3426 | 439/83 |
| 2006/0258200 A1 * | 11/2006 | Hao | H01R 12/57 | 439/342 |
| 2008/0101047 A1 * | 5/2008 | Wang | H01R 12/57 | 361/767 |
| 2008/0227324 A1 * | 9/2008 | Cheng | H01R 13/11 | 439/342 |
| 2009/0088016 A1 * | 4/2009 | Liao | H05K 3/3426 | 439/357 |
| 2014/0134853 A1 * | 5/2014 | Chang | H01R 13/6597 | 439/68 |
| 2014/0377992 A1 * | 12/2014 | Chang | H01R 13/6594 | 439/607.1 |

* cited by examiner

ELECTRICAL CONNECTOR AND ELECTRICAL CONNECTOR ASSEMBLY CAPABLE OF ENSURING TERMINAL POSITIONING EFFECT

CROSS-REFERENCE TO RELATED PATENT APPLICATION

This non-provisional application claims priority to and the benefit of, pursuant to 35 U.S.C. § 119(a), patent application Serial No. CN 201821212199.4 filed in China on Jul. 30, 2018. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector and an electrical connector assembly, and more particularly to an electrical connector with a low insertion force and an electrical connector assembly having the same.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Chinese Patent No. CN201120165910.7 discloses an electrical connector with a low insertion force, used for electrically connecting a chip module to a circuit board. The electrical connector includes: an insulating body penetratingly provided with multiple accommodating holes; multiple terminals correspondingly accommodated in the accommodating holes; and multiple solder balls, correspondingly located at the lower ends of the terminals.

The accommodating holes penetrate through the insulating body in an array. Each accommodating hole includes a through slot penetratingly provided on a top surface of the insulating body, and an accommodating groove concavely provided on a bottom surface of the insulating body. The accommodating groove is laterally communicated with the through slot. Each accommodating hole also has a shielding portion.

Each terminal includes a main portion correspondingly and fixedly provided in the through slot of one accommodating hole. Two extending portions extend from an upper end of the main portion to one side. Two contact arms extend downward from the two extending portions. A soldering portion extends from a lower end of the main portion to the other side. The shielding portion shields the upper ends of the main portion and the two extending portions. The soldering portion is accommodated in the accommodating groove, and includes two clamping arms provided annularly. A clamping space is formed between the two clamping arms, and the two clamping arms fixedly clamp one solder ball in the clamping space, such that the solder ball is likewise accommodated in the accommodating groove.

However, when the solder ball is assembled upward in the clamping space, the terminal is fixed with the through slot only by the main portion, and the solder ball easily pushes the terminal to move upward, such that the main portion and the two extending portion abut the shielding portion upward, thereby damaging the terminal and the insulating body, and affecting the flatness of the soldering portion. When a pin of the chip module is inserted downward in the through slot, the main portion and the two extending portions abut the shielding portion upward, such that it is difficult for the main portion and the two extending portions to move in the through slot, and the pin is prone to rigidly collide with the main portion and the two extending portions and thus cannot be smoothly inserted.

Therefore, a heretofore unaddressed need to design a novel electrical connector exists in the art to address the aforementioned deficiencies and inadequacies.

SUMMARY

The invention is directed to an electrical connector and an electrical connector assembly, capable of ensuring a terminal positioning effect and ensuring a reliable insertion.

To achieve the foregoing objective, the present invention adopts the following technical solutions.

An electrical connector includes: a body, provided with a plurality of accommodating holes penetrating through an upper surface and a lower surface of the body, wherein each of the accommodating holes has two opposite shielding portions; a plurality of terminals, correspondingly accommodated in the accommodating holes, each of the terminals comprising a base, two extending portions bending and extending from two opposite sides of the base, two contact arms extending downward from the two extending portions and toward each other, and two clamping portions bending and extending from two opposite sides of a lower end of the base, wherein an upper end of the base is exposed upward to a corresponding one of the accommodating holes, the shielding portions shield upper ends of the extending portions, and the two contact arms are configured for a pin of a plug to insert downward therebetween; and a plurality of solders, each of the solders being correspondingly clamped by the two clamping portions.

In certain embodiments, a receiving groove is provided between two adjacent ones of the accommodating holes for communication therebetween, each of a left side and a right side of the base is provided with a positioning portion and a position limiting portion, the positioning portion is located above the position limiting portion, the positioning portions fit with the corresponding one of the accommodating holes to position each of the terminals in a left-right direction, for two adjacent terminals of the terminals, two adjacent position limiting portions of the two adjacent terminals are accommodated in the same receiving groove, and the receiving groove has two position limiting surfaces opposite in a front-rear direction to limit the position limiting portion in the front-rear direction.

In certain embodiments, the positioning portion is in interference fit with the corresponding one of the accommodating holes, and the base is provided with a through hole located between the two positioning portions.

In certain embodiments, each of the extending portions has a guide chamfer, the guide chamfer extends to an upper end of each of the extending portions and is exposed upward to the corresponding one of the accommodating holes.

In certain embodiments, each of the contact arms is formed by extending along a straight line, and an inner surface of a free end of each of the contact arms forms an arc-shaped surface configured to be in contact with the pin.

In certain embodiments, the body is correspondingly provided with a plurality of protruding blocks, each of the protruding blocks corresponds to a corresponding one of the terminals and is formed by extending downward from the lower surface of the body, and each of the protruding blocks and the base of the corresponding one of the terminals are located on two opposite sides of the solder and jointly limit the solder from moving.

In certain embodiments, the clamping portions and the extending portions bend from a left side and a right side of the base and extend to a front side of the base, a stopping portion is formed by extending upward from at least one of the clamping portions, and the stopping portion is located above a corresponding one of the solders to stop the corresponding one of the solders from moving upward.

In certain embodiments, the two clamping portions and the stopping portion jointly clamp the corresponding one of the solders.

An electrical connector assembly includes a plug, having a plurality of pins; and an electrical connector for the plug to insert downward therein. The electrical connector includes: a body, provided with a plurality of accommodating holes penetrating through an upper surface and a lower surface of the body, wherein each of the accommodating holes has two opposite shielding portions; and a plurality of terminals, correspondingly accommodated in the accommodating holes, each of the terminals comprising a base, two extending portions bending and extending from two opposite sides of the base, two contact arms extending downward from the two extending portions and toward each other, and two clamping portions bending and extending from two opposite sides of a lower end of the base, wherein an upper end of the base is exposed upward to a corresponding one the accommodating hole, the shielding portions shield upper ends of the extending portions, one of the pins is inserted downward between the two contact arms and clamped by the two contact arms, and a solder is clamped by the two clamping portions.

In certain embodiments, the plug comprises a housing, the housing has a first surface and a second surface opposite to each other vertically, and a plurality of fixing grooves penetrating through the first surface and the second surface, the first surface is located above the second surface, the pins fit with and are fixed to the fixing grooves, a top end of each of the pins does not extend upward beyond the first surface, and the top end of each of the pins is downward concavely provided with a recess to accommodate a solder ball.

In certain embodiments, the top end of each of the pins is flush with the first surface.

In certain embodiments, the housing is downward concavely provided with a plurality of grooves, each of the grooves is formed at one side of a corresponding one of the fixing grooves, each of the grooves is communicated with the corresponding one of the fixing grooves and configured to accommodate the solder ball, and each of a bottom surface of each of the grooves and a bottom surface of the recess has an arc-shaped surface matching with a shape of the solder ball.

In certain embodiments, the housing is downward concavely provided with a plurality of opening slots, each of the opening slots is formed at an opposite side of the corresponding one of the fixing grooves, each of the opening slots is communicated with the corresponding one of the fixing grooves, the opening slots do not penetrate downward through the second surface, and a depth of each of the opening slots is greater than a depth of the groove.

In certain embodiments, the pins comprise at least one first pin and at least one second pin with different lengths, a top end of the first pin and a top end of the second pin have a same height, and a bottom end of the first pin and a bottom end of the second pin have different heights.

In certain embodiments, the pins comprise a plurality of first pins and a plurality of second pins, the first pins are arranged in a plurality of first rows, the second pins are arranged in a plurality of second rows, and the first rows and the second rows are alternately provided.

In certain embodiments, the pins comprise a plurality of first pins and a plurality of second pins, and the first pins are surroundingly provided outside the second pins.

In certain embodiments, a length of each of the first pins is greater than a length of each of the second pins.

In certain embodiments, each of the accommodating holes has a first wall and a second wall opposite to each other, the extending portion is located closer to the second wall than the base, a bottom end of each of the pins is provided with a guide surface corresponding to the upper end of the base, and a width of the guide surface along a horizontal direction is greater than a distance between an inner edge of the upper end of the base and the first wall.

In certain embodiments, the base is provided with two opposite positioning portions and a through hole located between the two positioning portions, the positioning portions fit with the corresponding one of the accommodating holes to position each of the terminals, and when the one of pins is inserted downward to a final position, a bottom end of the one of the pins is lower than a top end of the through hole.

In certain embodiments, each of the pins is flat plate shaped, each of the contact arms is formed by extending along a straight line, and an inner surface of a free end of each of the contact arms forms an arc-shaped surface to be in contact with a plate surface of each of the pins.

Compared with the related art, the electrical connector and the electrical connector assembly according to certain embodiments of the invention have the following beneficial effects:

The upper end of the base is exposed upward to the corresponding accommodating hole. When the solder is assembled upward between the two clamping portions, the upper end of the base may be abutted downward by a tool, thereby limiting the terminal from moving upward, and ensuring the positioning effect of the terminal in the accommodating hole. When the pin is inserted downward in the accommodating hole, the shielding portions shield the upper ends of the extending portions, such that the pin does not collide with the upper ends of the two extending portions. Further, the base and the two extending portions are movable in the accommodating hole, a relative position between the pin and the two extending portions may be appropriately adjusted, thereby facilitating the smooth insertion of the pin, and ensuring the reliable insertion of the pin and the two contact arms.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
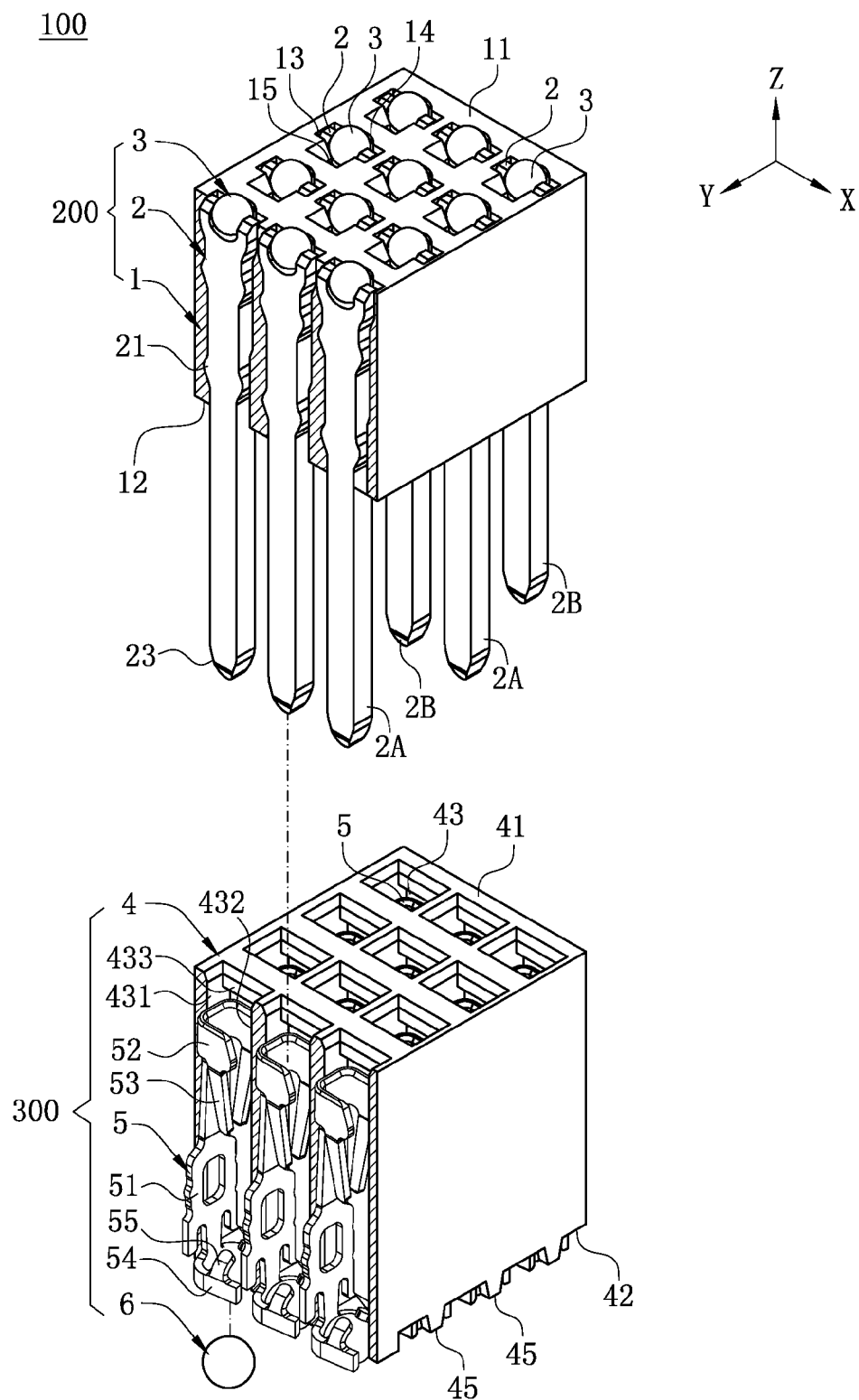
FIG. 1 is a perspective view of an electrical connector and a plug before insertion according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an electrical connector and an electrical connector assembly.

As shown in FIG. 1, an electrical connector assembly 100 according to one embodiment of the present invention defines a front-rear direction X, and a left-right direction Y and a vertical direction Z perpendicular to the front-rear direction X.

As shown in FIG. 1, the electrical connector assembly 100 according to the embodiment of the present invention includes a plug 200 of a staggered pin grid array and an electrical connector 300 for the plug 200 to be downward inserted therein.

Figure 2:
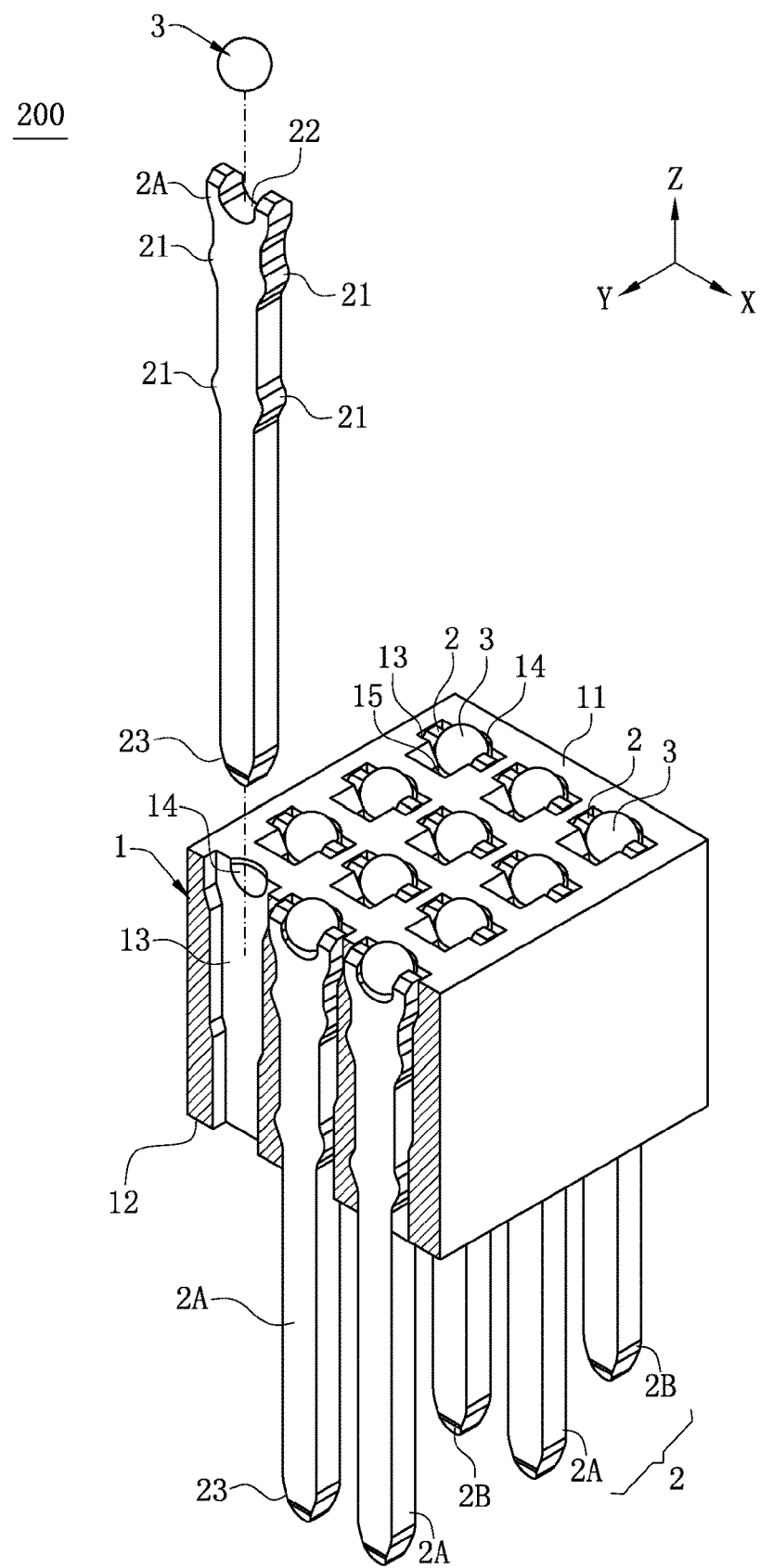
FIG. 2 is a perspective view of the plug in FIG. 1.

As shown in FIG. 1 and FIG. 2, the plug 200 includes a housing 1, multiple pins 2 accommodated in the housing 1, and multiple solder balls 3 correspondingly fixed on the pins 2.

As shown in FIG. 1 and FIG. 2, the housing 1 is made of an insulating material. The housing 1 has a first surface 11 and a second surface 12 opposite to each other vertically, and multiple fixing grooves 13 penetrating through the first surface 11 and the second surface 12 vertically. The first surface 11 is located above the second surface 12.

Figure 3:
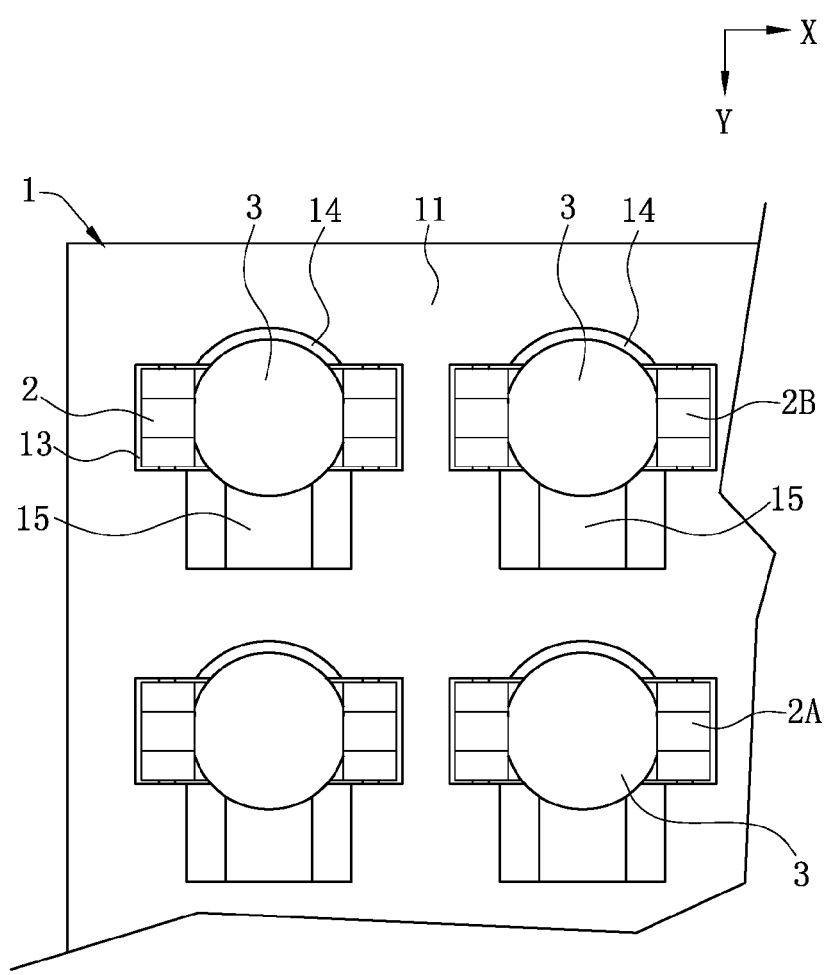
FIG. 3 is a top view of the plug in FIG. 2.
Figure 10:
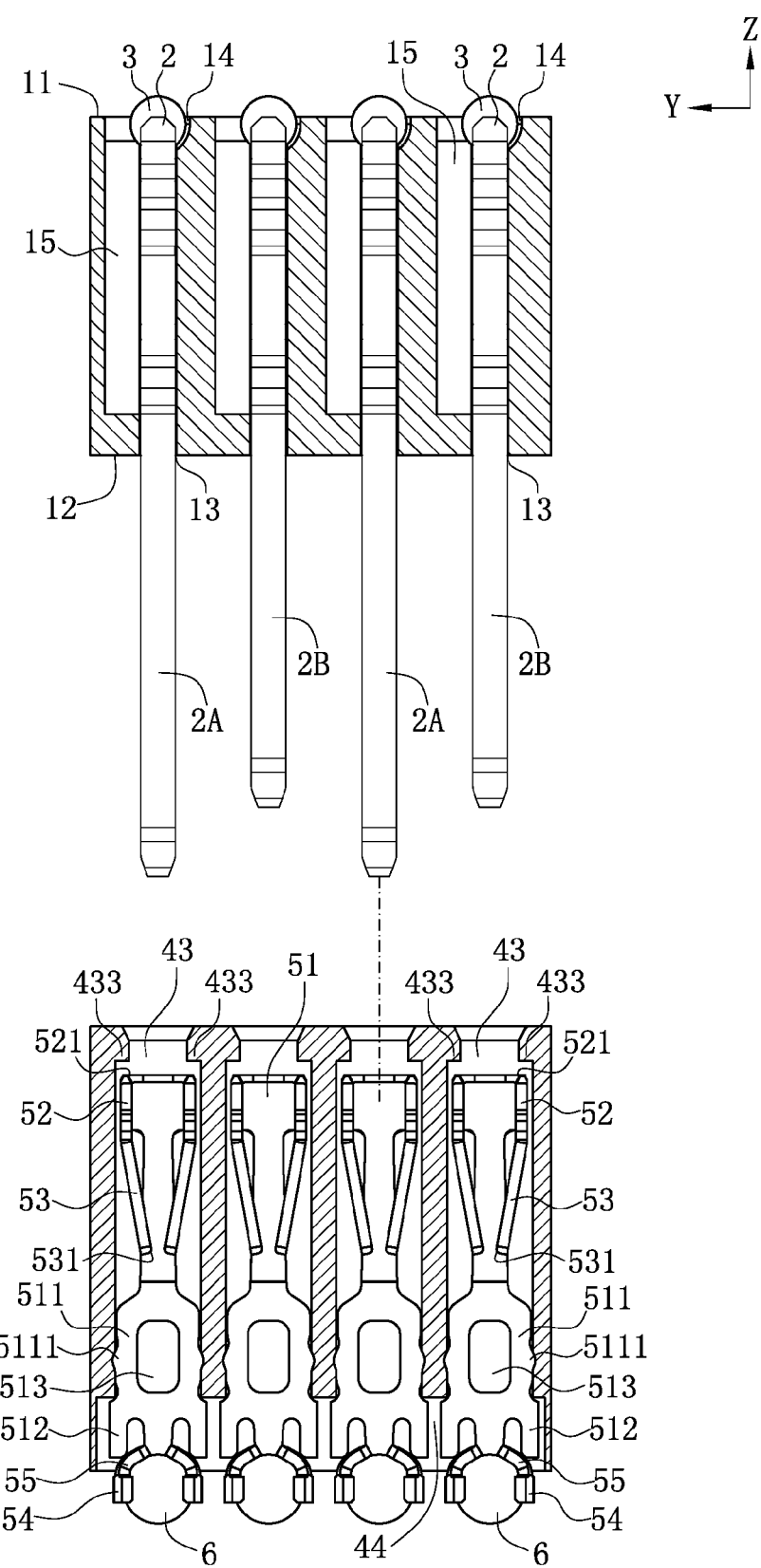
FIG. 10 is a front view of the electrical connector and the plug before insertion in FIG. 9.

As shown in FIG. 2, FIG. 3 and FIG. 10, the housing 1 is downward concavely provided with a groove 14 corresponding to a right side of each fixing groove 13. The groove 14 is communicated with the fixing groove 13, and is used to accommodate the solder ball 3. The groove 14 is downward concavely formed on the first surface 11, and does not penetrate downward through the second surface 12. A bottom surface of the groove 14 has an arc-shaped surface 531 matching with the shape of the solder ball 3.

As shown in FIG. 2, FIG. 3 and FIG. 10, the housing 1 is downward concavely provided with an opening slot 15 corresponding to a left side of each fixing groove 13. The opening slot 15 is communicated with the fixing groove 13. The opening slot 15 is downward concavely formed on the first surface 11, and does not penetrate downward through the second surface 12. A depth of the opening slot 15 is greater than a depth of the groove 14.

Figure 6:
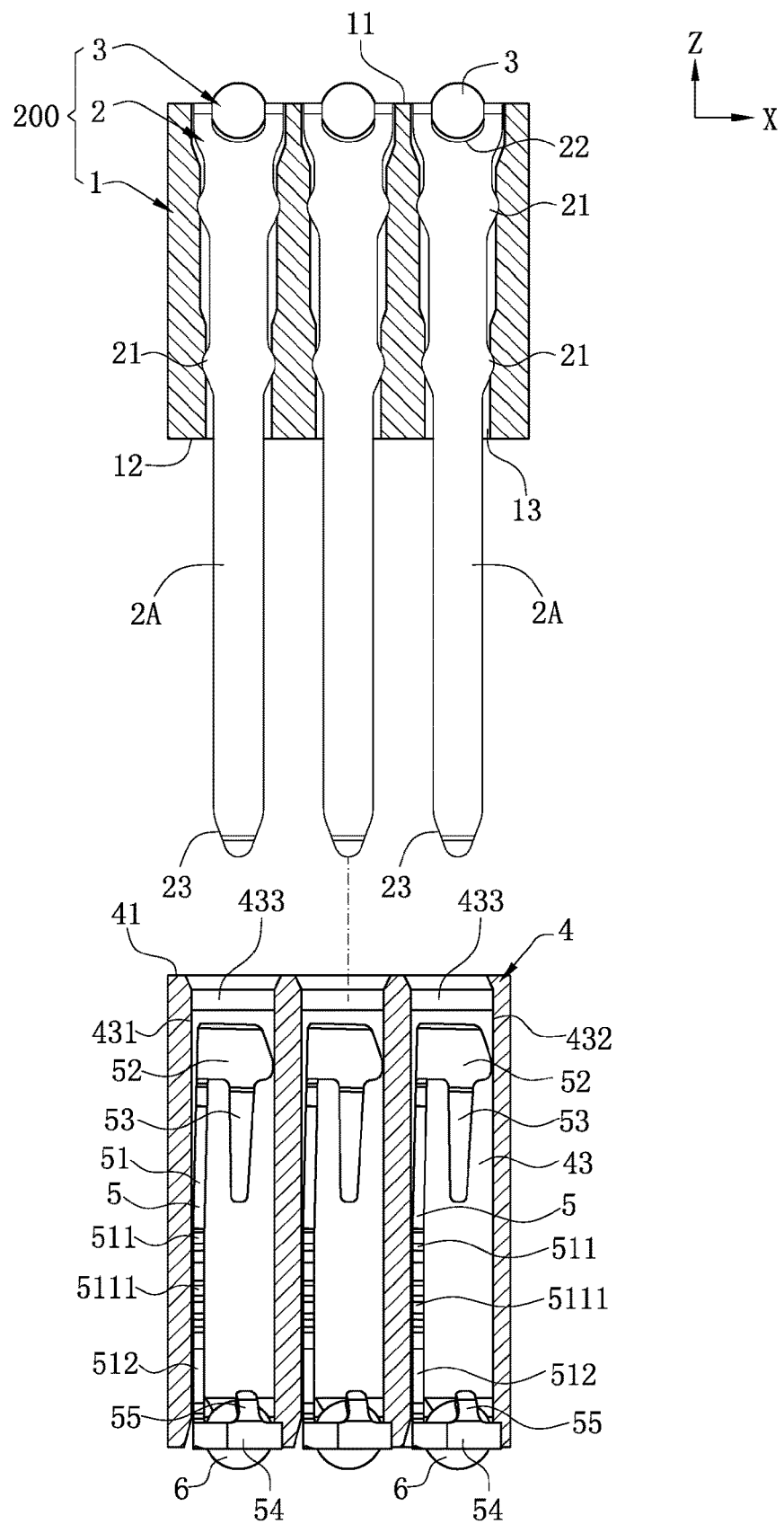
FIG. 6 is a left view of the electrical connector and the plug before insertion in FIG. 1.

As shown in FIG. 2 and FIG. 6, each pin 2 is made of a metal material and is flat plate shaped. Multiple protruding stabs 21 are protrudingly provided at front and rear sides of the pin 2 respectively and are in interference fit with the fixing groove 13.

As shown in FIG. 2 and FIG. 6, a top end of each pin 2 is flush with the first surface 11. In other embodiments, the top end of each pin 2 may also be located between the first surface 11 and the second surface 12. A top end of each pin 2 is downward concavely provided with a recess 22, which is used to fix the solder ball 3. The solder ball 3 is higher than the first surface 11 to solder the plug 200 to an electronic element (not shown in the figure). A bottom surface of the recess 22 has an arc-shaped surface 531 matching with the shape of the solder ball 3. In other embodiments, a bottom end of the solder ball 3 abut the bottom surface of the recess 22 downward.

As shown in FIG. 2 and FIG. 6, a bottom end of each pin 2 extends downward beyond the second surface 12, and the bottom end of each pin 2 is provided with a guide surface 23.

As shown in FIG. 2 and FIG. 10, the pins 2 include multiple first pins 2A arranged in multiple first rows and multiple second pins 2B arranged in multiple second rows, and the first rows of the first pins 2A and the second rows of the second pins 2B are alternately provided. In other words, the first rows and the second rows are alternately provided, each of the first rows only includes the first pins 2A, and each of the second rows only includes the second pins 2B. A length of each first pin 2A is greater than a length of each second pin 2B. A top end of each first pin 2A and a top end of each second pin 2B have a same height, and a bottom end of each first pin 2A is lower than a bottom end of each second pin 2B. In other embodiments, there is only one first pin 2A, or there is only one second pin 2B, or there are only one first pin 2A and only one second pin 2B.

Figure 4:
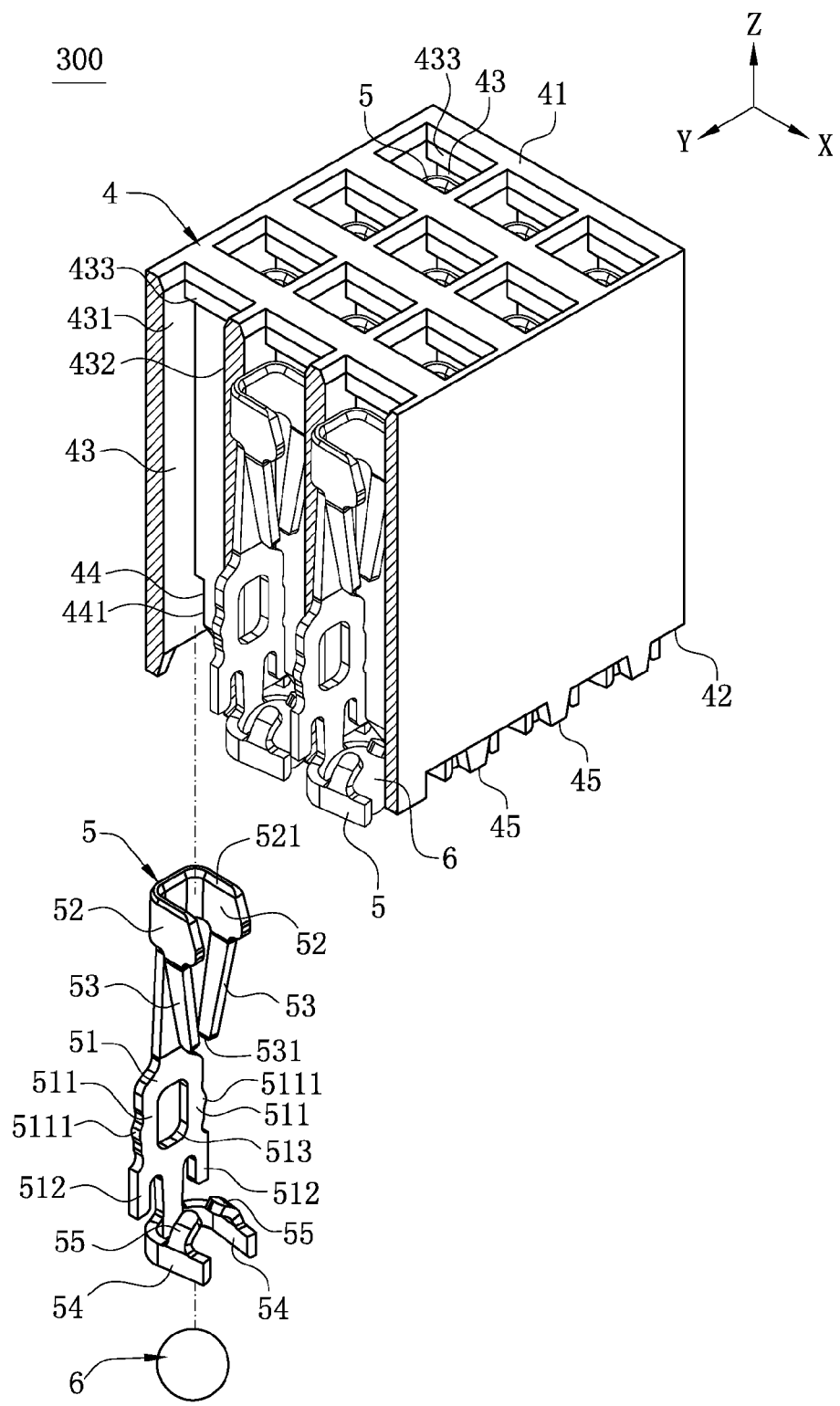
FIG. 4 is a perspective view of the electrical connector in FIG. 1.

As shown in FIG. 1 and FIG. 4, the electrical connector 300 includes a body 4, multiple terminals 5 accommodated in the body 4, and multiple solders 6.

Figure 5:
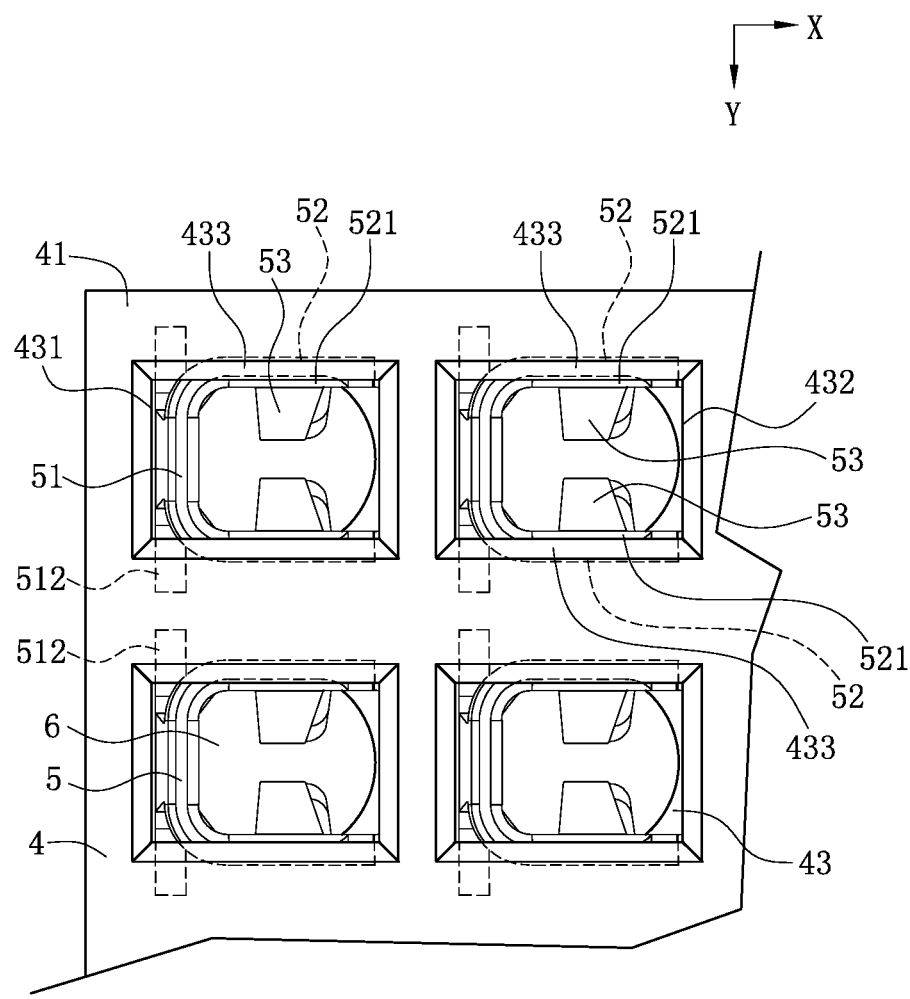
FIG. 5 is a top view of the electrical connector in FIG. 4.

As shown in FIG. 4, FIG. 5 and FIG. 6, the body 4 is made of an insulating material. The body 4 has an upper surface 41 and a lower surface 42 opposite to each other, and multiple accommodating holes 43 penetrating through the upper surface 41 and the lower surface 42 vertically. Each accommodating hole 43 has a first wall 431 and a second wall 432 opposite in the front-rear direction, and two shielding portions 433 connecting the first wall 431 and the second wall 432 and opposite to each other in the left-right direction. The first wall 431 is located behind the second wall 432. A top surface of the shielding portion 433 is flush with the upper surface 41.

Figure 9:
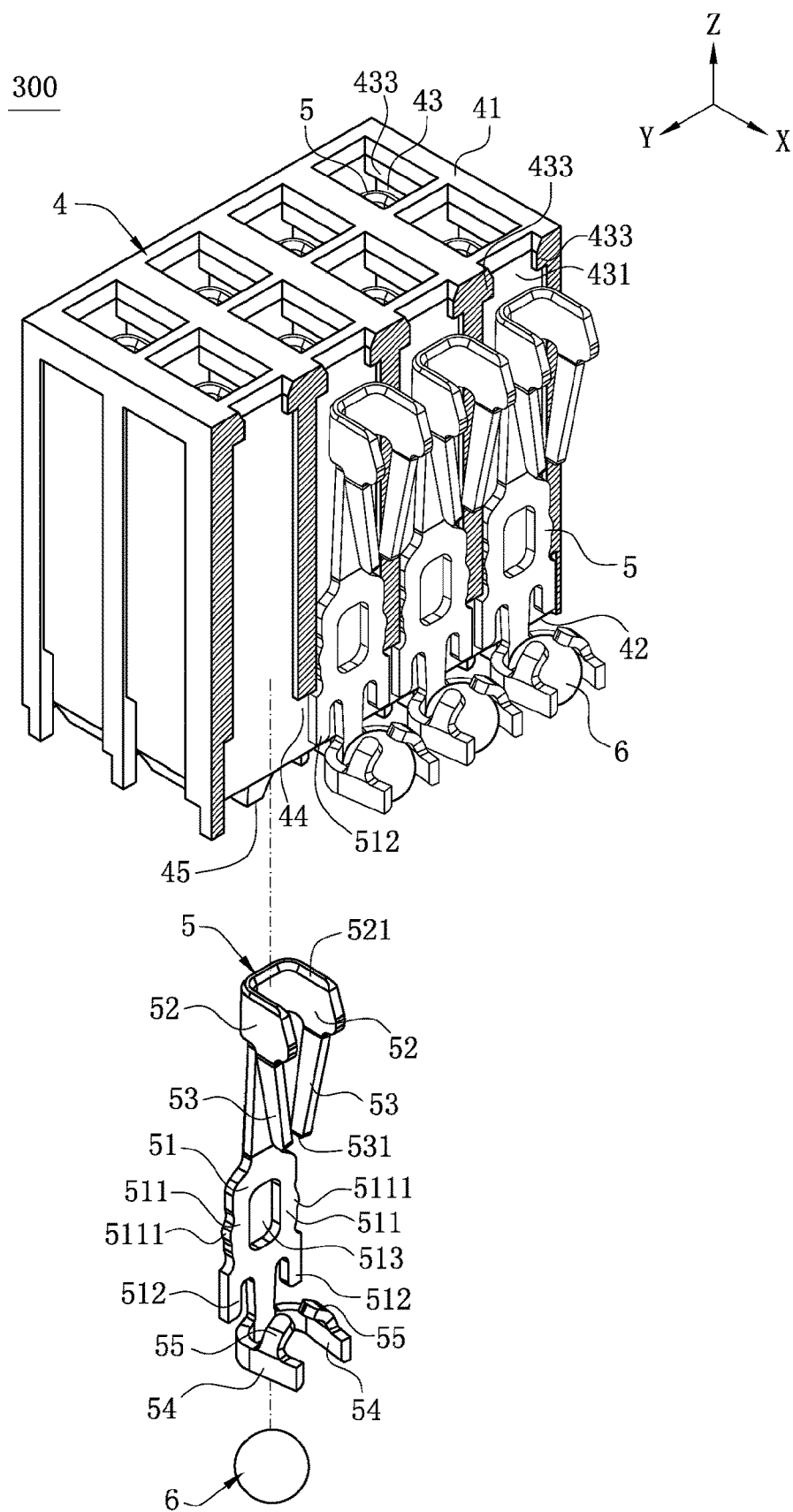
FIG. 9 is a perspective view of the electrical connector in FIG. 1 from another viewing angle.
Figure 12:
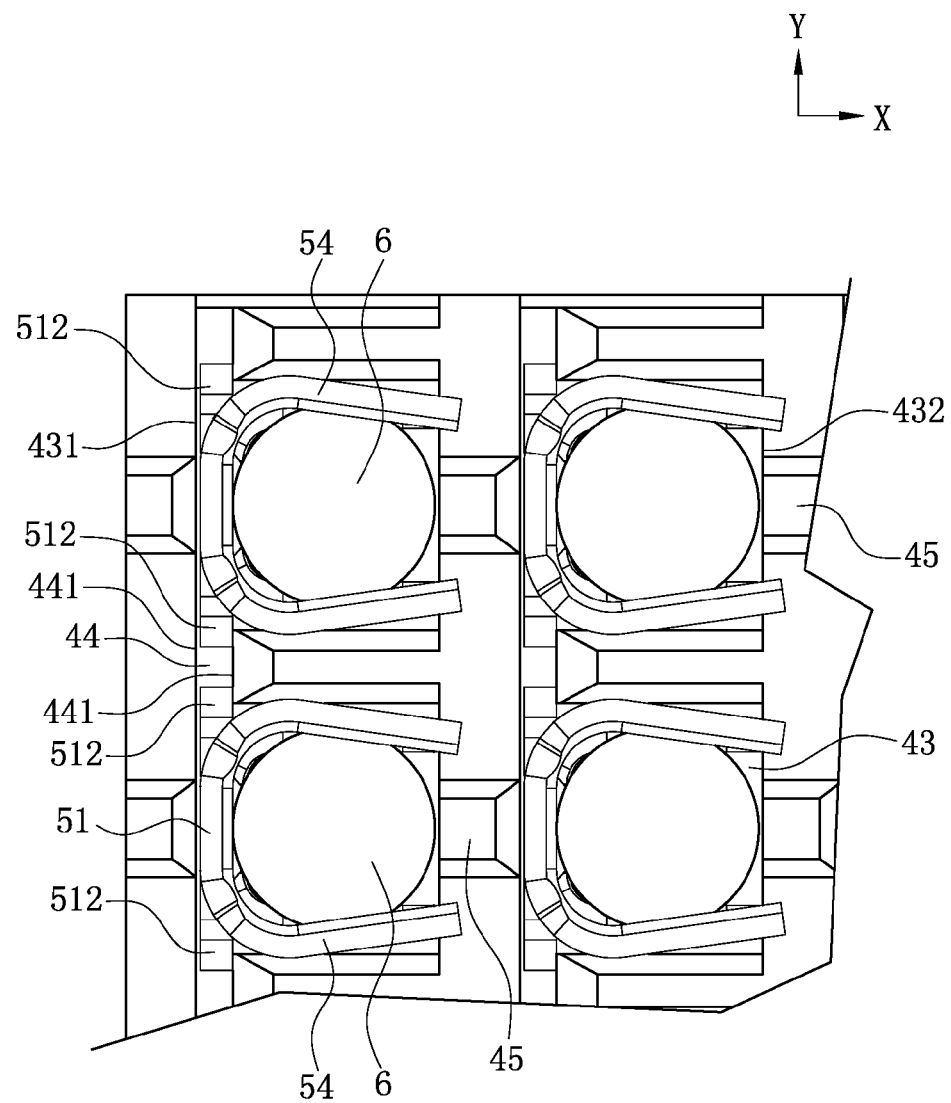
FIG. 12 is a bottom view of the electrical connector in FIG. 9.

As shown in FIG. 9, FIG. 10 and FIG. 12, a receiving groove 44 is provided between two adjacent accommodating holes 43 for communication therebetween. The receiving groove 44 is upward concavely provided on the lower surface 42, and does not penetrate upward through the upper surface 41. Each receiving groove 44 has two position limiting surfaces 441 opposite to each other in the front-rear direction.

As shown in FIG. 4, FIG. 9 and FIG. 12, the body 4 is provided with multiple protruding blocks 45, and each protruding block 45 corresponds to one of the accommodating holes 43. Each protruding block 45 extends downward from the lower surface 42. A rear side of each protruding block 45 is flush with the second wall 432, and each protruding block 45 is located in front of the corresponding solder 6 to limit the solder 6 from moving forward.

As shown in FIG. 4 and FIG. 9, each terminal 5 is made of a metal material and assembled upward into the corresponding accommodating hole 43. Each terminal 5 includes a base 51, two extending portions 52, two contact arms 53, two clamping portions 54, and two stopping portions 55.

Figure 8:
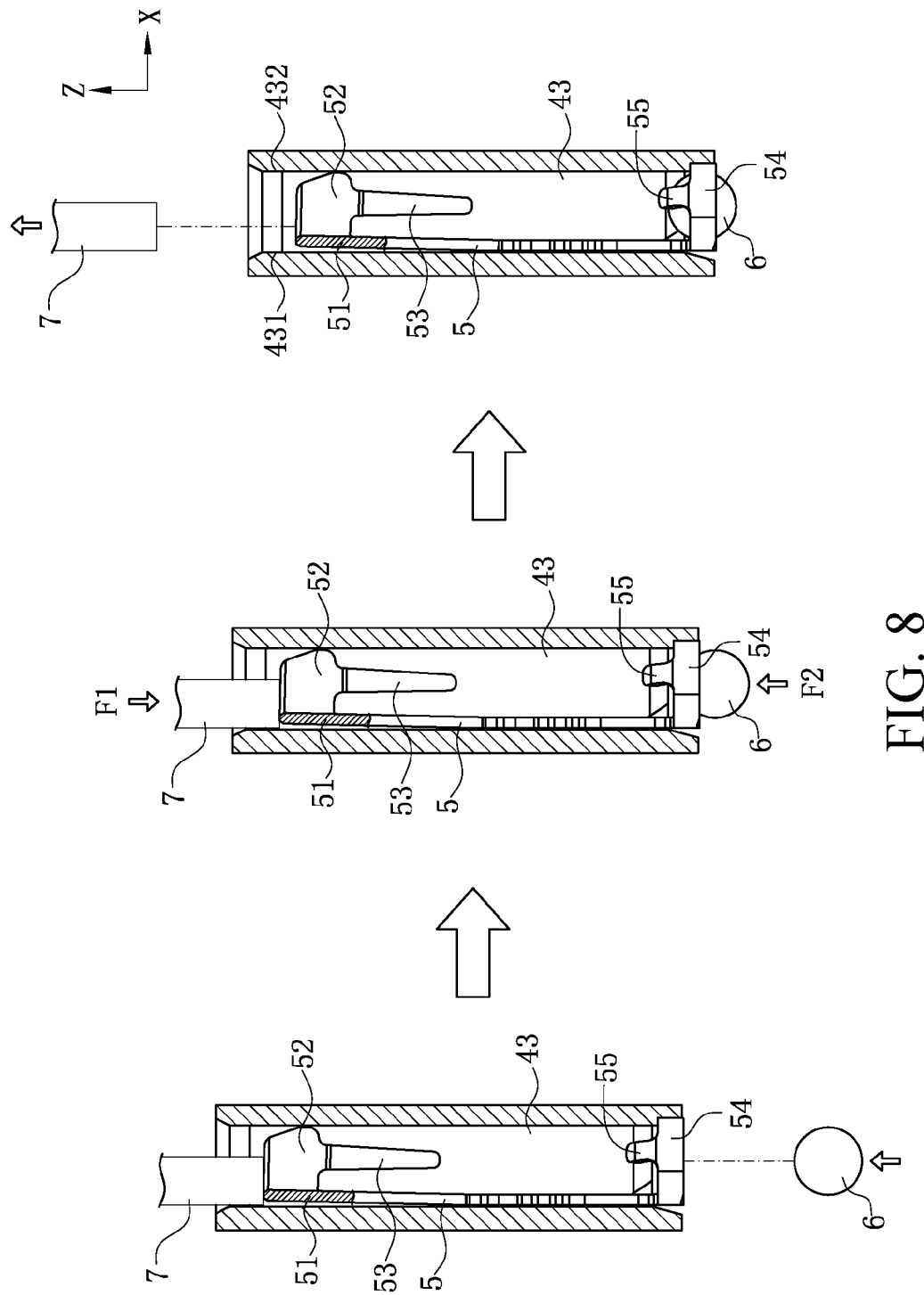
FIG. 8 is a schematic view of a solder assembled upward to a terminal in FIG. 4.

As shown in FIG. 4, FIG. 5 and FIG. 8, the base 51 is plate shaped, and an upper end of the base 51 is exposed upward to the corresponding accommodating hole 43 for a tool 7 to abut downward. As shown in FIG. 12, a lower end of the base 51 is located behind the corresponding solder 6 to limit the solder 6 from moving backward.

As shown in FIG. 9, FIG. 10 and FIG. 12, each of a left side and a right side of the base 51 is respectively provided with a positioning portion 511 and a position limiting portion 512. The positioning portion 511 is located above the position limiting portion 512. Each positioning portion 511 is provided with at least one barb 5111 protruding outward to be in interference fit with the corresponding accommodating hole 43 to position the terminal 5 in the left-right direction Y. The adjacent position limiting portions 512 of two adjacent terminals 5 are accommodated in the same receiving groove 44. The position limiting portions 512 fits with the position limiting surfaces 441 to limit the position limiting portions 512 in the front-rear direction X. A top surface of the receiving groove 44 is located right above the position limiting portions 512 to limit the position limiting portions 512 from moving upward.

Figure 11:
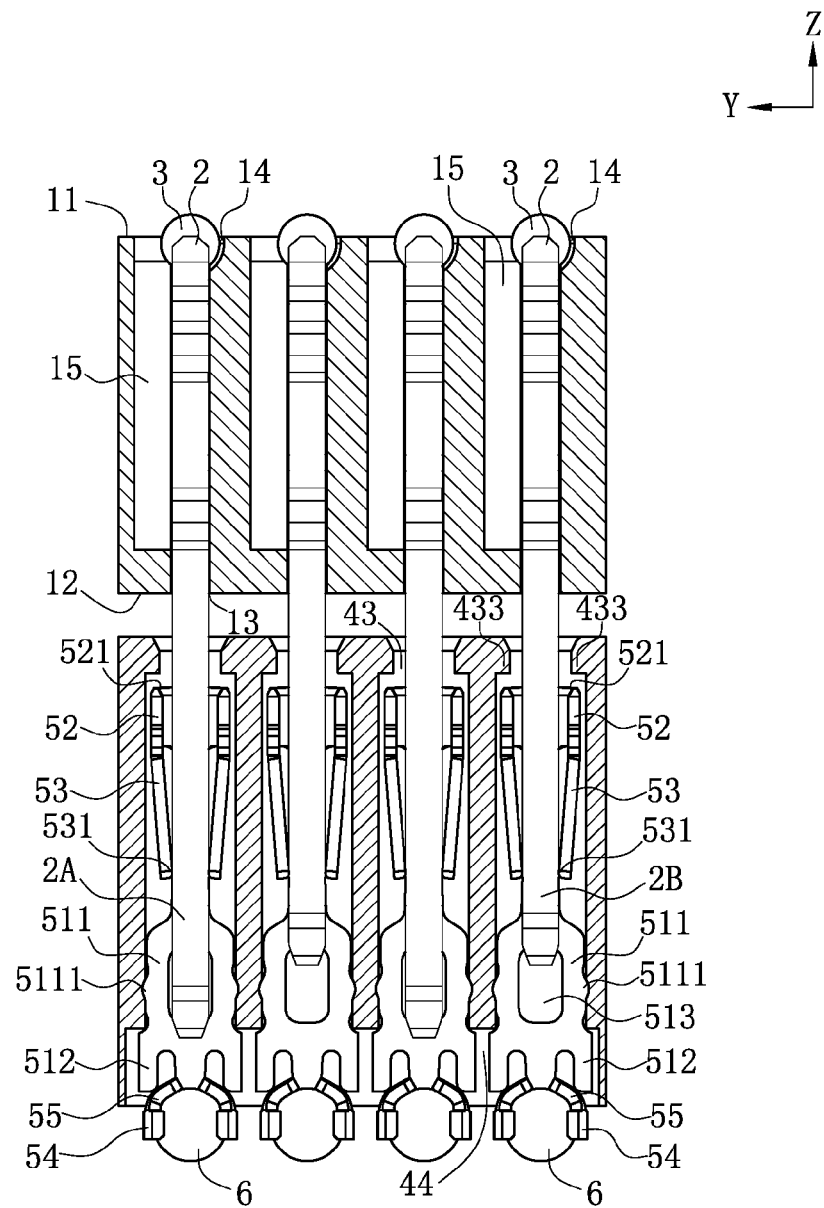
FIG. 11 is a schematic view of the electrical connector and the plug after insertion in FIG. 10.

As shown in FIG. 9 and FIG. 10, the base 51 is further provided with a through hole 513 located between the two positioning portions 511 to enhance the elasticity of the positioning portions 511. As shown in FIG. 11, when the pin 2 is inserted downward to a final position, the bottom end of the pin 2 is lower than a top end of the through hole 513.

Figure 7:
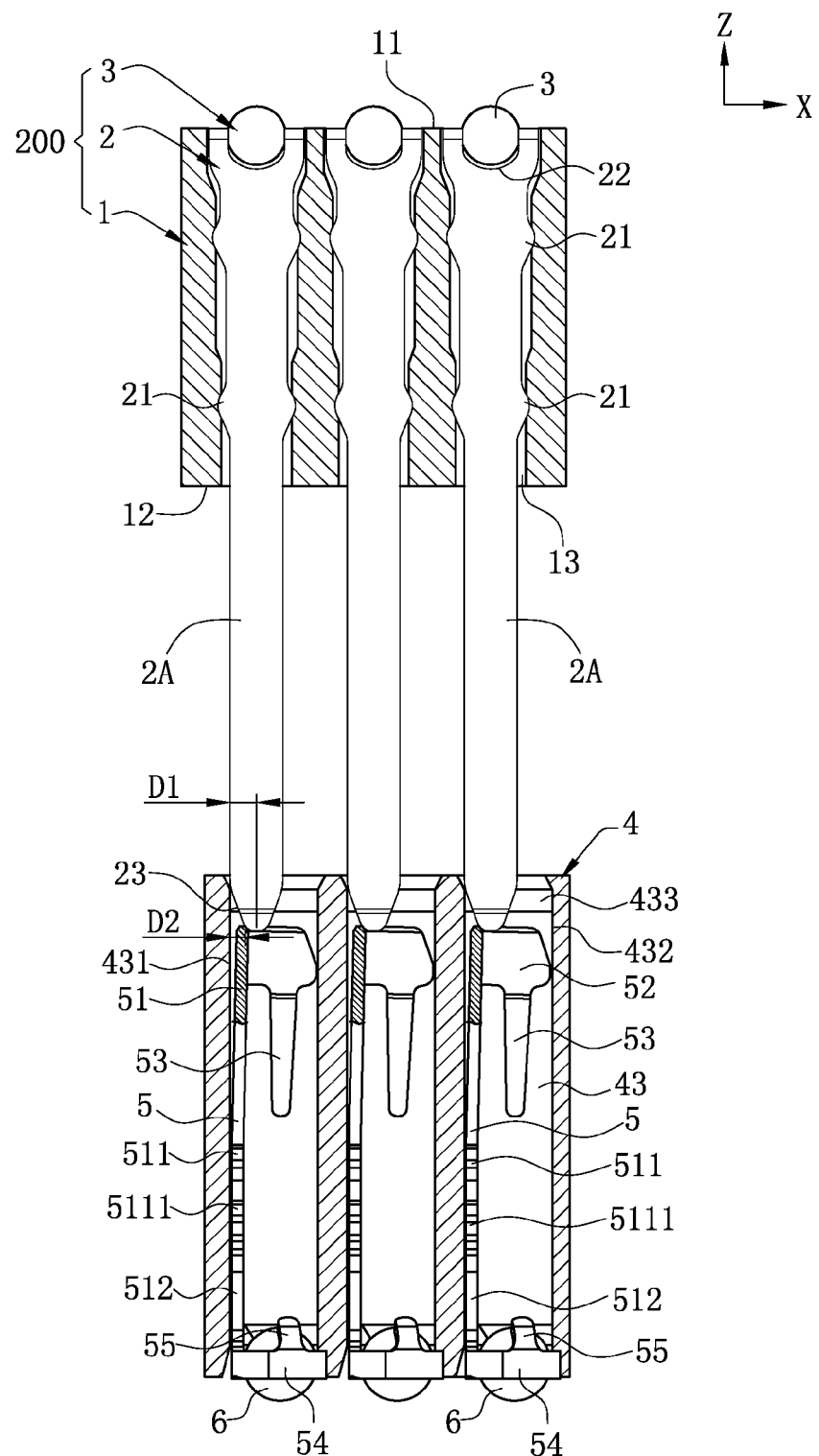
FIG. 7 is a schematic view of the plug being inserted into the electrical connector by deviating from a normal position in FIG. 6.

As shown in FIG. 4 and FIG. 5, the two extending portions 52 bend from the left side and the right side of the upper end of the base 51 and extend forward to a front side of the base 51, and the two extending portions 52 are perpendicular to the base 51. As shown in FIG. 7, the extending portion 52 is closer to the second wall 432 than the base 51, and a width D1 of the guide surface 23 along a horizontal direction is greater than a distance D2 between an inner edge of the upper end of the base 51 and the first wall 431. When a plate surface of the pin 2 is attached to the first wall 431 and inserted downward, the bottom end of the pin 2 can be prevented from colliding downward with the upper end of the base 51.

As shown in FIG. 4, FIG. 5 and FIG. 10, each extending portion 52 has a guide chamfer 521. The guide chamfer 521 extends upward to an upper end of the extending portion 52, and is exposed upward to the accommodating hole 43 to guide the pin 2 to be inserted downward. The shielding portions 433 shield the upper ends of the extending portions 52, such that the bottom end of the pin 2 can be prevented from colliding downward with the upper ends of the two extending portions 52.

As shown in FIG. 9, FIG. 10 and FIG. 11, the two contact arms 53 extend downward from lower ends of the two extending portions 52 toward each other. Each contact arm 53 and the corresponding extending portion 52 altogether form a clamping arm. In other words, the two contact arms 53 and the two extending portions 52 correspondingly form two clamping arms. The pin 2 is inserted downward between the two contact arms 53 and clamped by the two contact arms 53. Each contact arm 53 extends downward along a straight line, and an inner surface of a free end of each contact arm 53 forms an arc-shaped surface 531 to be in contact with the plate surface of the pin 2. As shown in FIG. 6, a width of each contact arm 53 is gradually reduced downward from the top.

As shown in FIG. 9 and FIG. 10, the two clamping portions 54 bend from two opposite sides of the lower end of the base 51 and extend forward to the front side of the base 51 and clamp the solder 6, so as to solder the electrical connector 300 to a circuit board (not shown in the figure).

As shown in FIG. 9 and FIG. 10, the two stopping portions 55 bend and extend upward from upper ends of the two clamping portions 54 toward each other, and the two stopping portions 55 are located right above the solder 6 and clamp the solder 6. In other embodiments, there is only one stopping portion 55 provided on one of the clamping portions 54.

As shown in FIG. 8, when the solder 6 is assembled, the tool 7 is first inserted downward into the accommodating hole 43 and abuts the upper end of the base 51. Then, the solder 6 is extruded upward and clamped by the two clamping portions 54 until the solder 6 abuts the two stopping portions 55 upward. Since an acting force F1 of the tool 7 on the terminal 5 is balanced with an acting force F2 of the solder 6 on the terminal 5, the terminal 5 is limited from moving upward, thereby ensuring the fixing effect of the terminal 5.

Figure 13:
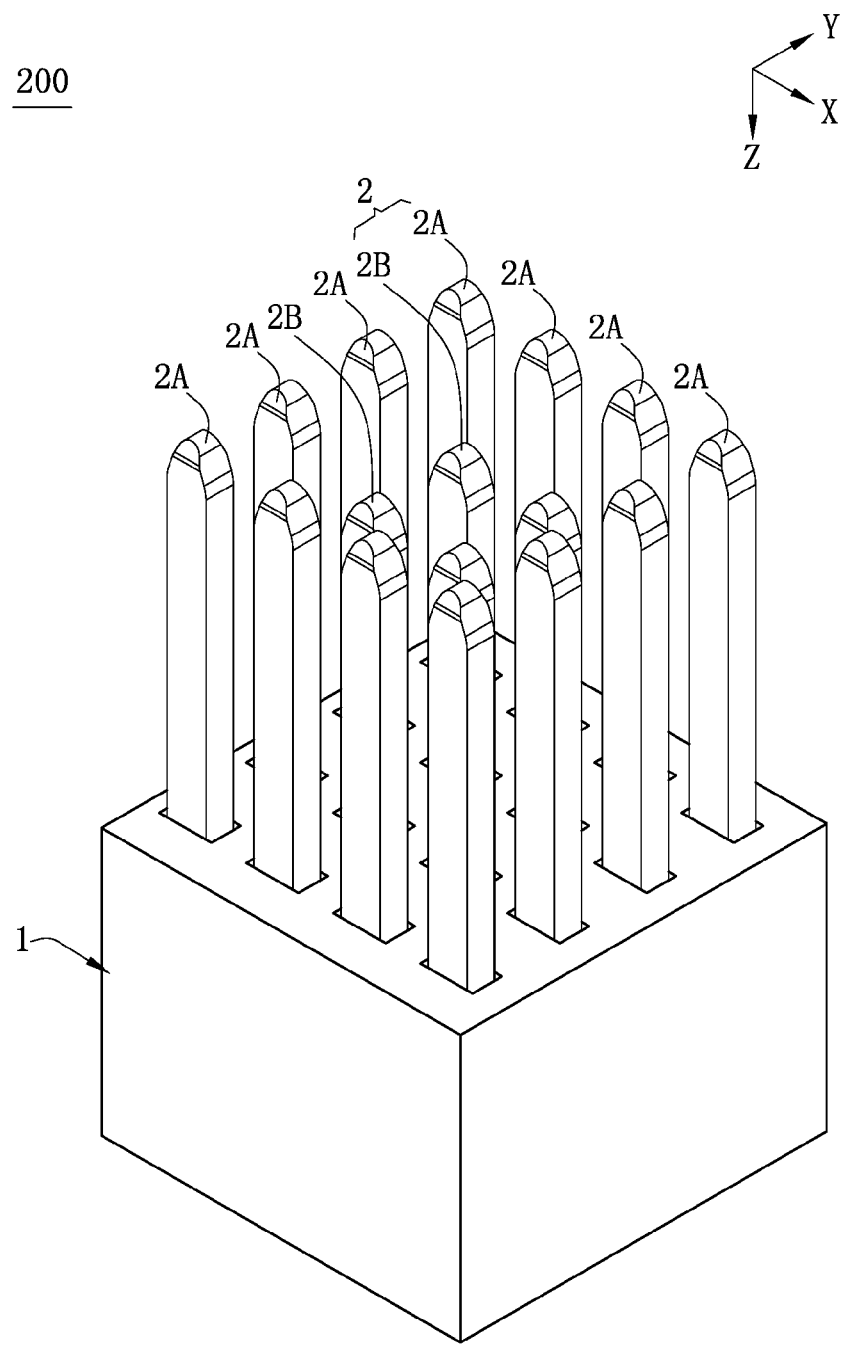
FIG. 13 is a perspective view of a plug according to another embodiment of the present invention.

FIG. 13 shows a plug 200 according to another embodiment of the present invention. The difference of the plug 200 in this embodiment from the plug 200 of the foregoing embodiment mainly exists in that the first pins 2A are surroundingly provided outside the multiple second pins 2B. In other embodiments, the second pins 2B can be surroundingly provided outside the first pins 2A.

To sum up, the electrical connector and the electrical connector assembly according to certain embodiments of the present invention has the following beneficial effects:

(1) The upper end of the base 51 is exposed upward to the corresponding accommodating hole 43. When the solder 6 is clamped upward by the two clamping portions 54, the upper end of the base 51 may be abutted downward by a tool 7, thereby limiting the terminal 5 from moving upward, and ensuring the positioning effect of the terminal 5 in the accommodating hole 43. When the pin 2 is inserted downward into the accommodating hole 43, the shielding portions 433 shield the upper end of the extending portions 52, such that the pin 2 does not collide with the upper ends of the two extending portions 52. Further, the base 51 and the two extending portions 52 are movable in the accommodating hole 43, a relative position between the pin 2 and the two extending portions 52 may be appropriately adjusted, thereby facilitating the smooth insertion of the pin 2, and ensuring the reliable insertion of the pin 2 and the two contact arms 53.

(2) The receiving groove 44 communicates two adjacent accommodating holes 43, thereby avoiding short shot during the molding of the body 4. The receiving groove 44 limits positions of the position limiting portions 512 of two adjacent terminals 5, thereby enhancing the positioning effect of the terminal 5.

(3) The guide chamfer 521 extends to the upper end of the extending portion 52, and is exposed upward to the accommodating hole 43 to guide the pin 2 to be inserted downward. Since the shielding portion 521 and the extending portion 433 are provided as such, the bottom end of the pin 2 can be prevented from colliding downward with the upper ends of the two extending portions 52.

(4) Each contact arm 53 extends along a straight line, thereby simplifying the structure of the contact arm 53. An inner surface of a free end of each contact arm 53 forms an arc-shaped surface 531 to be in contact with the pin 2, thereby enhancing the contact stability therebetween.

(5) The clamping portions 54 and the stopping portions 55 jointly position the solder 6. When the solder 6 is soldered and fused, the clamping portions 54 drive the stopping portions 55 to shrink, such that the clamping portions 54 and the stopping portions 55 jointly extrude the solder 6, thereby damaging an oxide layer on a surface of the solder 6, and enhancing the soldering effect of the solder 6.

(6) The groove 14 and the recess 22 jointly receive the solder ball 3, and each of the bottom surface of the groove 14 and the bottom surface of the recess 22 has an arc-shaped surface 531 matching with the shape of the solder ball 3 respectively. When the solder ball 3 is soldered and fused, the groove 14 and the recess 22 limit the solder ball 3 from excessive loss, thereby ensuring the soldering effect of the solder ball 3.

(7) The opening slot 15 and the fixing groove 13 are communicated to each other, and the depth of the opening slot 15 is greater than the depth of the groove 14. When the housing 1 forms the fixing groove 13 and the opening slot 15 through a mold core simultaneously, the strength of the mold core is enhanced, thereby avoiding deformation of the mold core during plastic injection, and ensuring the dimensional accuracy of the fixing groove 13.

(8) The top end of each first pin 2A and the top end of each second pin 2B have the same height, and the bottom end of each first pin 2A and the bottom end of each second pin 2B have different heights, such that the first pins 2A and the second pins 2B are in contact with the contact arm 53 in sequence, thereby reducing the maximum insertion force of the pin 2.

(9) The width D1 of the guide surface 23 along a horizontal direction is greater than the distance D2 between an inner edge of the upper end of the base 51 and the first wall 431. When the plate surface of the pin 2 is attached to the first wall 431 and inserted downward, the bottom end of the pin 2 can be prevented from colliding downward with the upper end of the base 51.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:
   a body, provided with a plurality of accommodating holes penetrating through an upper surface and a lower surface of the body, wherein each of the accommodating holes has two opposite shielding portions, the body is correspondingly provided with a plurality of protruding blocks, and each of the protruding blocks is formed by extending downward from the lower surface of the body;
   a plurality of terminals, correspondingly accommodated in the accommodating holes, each of the terminals comprising a base, two extending portions bending and extending from two opposite sides of the base, two contact arms extending downward from the two extending portions and toward each other, and two clamping portions bending and extending from two opposite sides of a lower end of the base, wherein each of the protruding blocks corresponds to a corresponding one of the terminals, an upper end of the base is exposed upward to a corresponding one of the accommodating holes, the shielding portions are located above the extending portions and downward shield upper ends of the extending portions, and the two contact arms are configured for a pin of a plug to insert downward therebetween; and a plurality of solders, each of the solders being correspondingly clamped by the two clamping portions, wherein each of the protruding blocks and the base of the corresponding one of the terminals are located on two opposite sides of a corresponding solder of the solders and jointly limit the corresponding solder from moving.

2. The electrical connector of claim 1, wherein:

a receiving groove is provided between two adjacent ones of the accommodating holes for communication therebetween;

each of a left side and a right side of the base is provided with a positioning portion and a position limiting portion, and the positioning portion is located above the position limiting portion;

the positioning portions fit with the corresponding one of the accommodating holes to position each of the terminals in a left-right direction;

for two adjacent terminals of the terminals, two adjacent position limiting portions of the two adjacent terminals are accommodated in the same receiving groove; and the receiving groove has two position limiting surfaces opposite in a front-rear direction to limit the position limiting portion in the front-rear direction.

3. The electrical connector of claim 2, wherein the positioning portion is in interference fit with the corresponding one of the accommodating holes, and the base is provided with a through hole located between the two positioning portions.

4. The electrical connector of claim 1, wherein each of the extending portions has a guide chamfer, the guide chamfer extends to an upper end of each of the extending portions and is exposed upward to the corresponding one of the accommodating holes.

5. The electrical connector of claim 1, wherein each of the contact arms is formed by extending along a straight line, and an inner surface of a free end of each of the contact arms forms an arc-shaped surface configured to be in contact with the pin.

6. The electrical connector of claim 1, wherein the clamping portions and the extending portions bend from a left side and a right side of the base and extend to a front side of the base, a stopping portion is formed by extending upward from at least one of the clamping portions, and the stopping portion is located above a corresponding one of the solders to stop the corresponding one of the solders from moving upward.

7. The electrical connector of claim 6, wherein the two clamping portions and the stopping portion jointly clamp the corresponding one of the solders.

8. An electrical connector assembly, comprising:

a plug, having a plurality of pins; and an electrical connector for the plug to insert downward therein, the electrical connector comprising:

a body, provided with a plurality of accommodating holes penetrating through an upper surface and a lower surface of the body, wherein each of the accommodating holes has two opposite shielding portions and a first wall and a second wall opposite to each other; and a plurality of terminals, correspondingly accommodated in the accommodating holes, each of the terminals comprising a base, two extending portions bending and extending from two opposite sides of the base, two contact arms extending downward from the two extending portions and toward each other, and two clamping portions bending and extending from two opposite sides of a lower end of the base, wherein an upper end of the base is exposed upward to a corresponding one of the accommodating holes, the shielding portions are located above the extending portions and downward shield upper ends of the extending portions, one of the pins is inserted downward between the two contact arms and clamped by the two contact arms, each of the extending portions is located closer to the second wall than the base, a bottom end of each of the pins is provided with a guide surface corresponding to the upper end of the base, a width of the guide surface along a horizontal direction is greater than a distance between an inner edge of the upper end of the base and the first wall, and a solder is clamped by the two clamping portions.

9. The electrical connector assembly of claim 8, wherein the pins comprise at least one first pin and at least one second pin with different lengths, a top end of the first pin and a top end of the second pin have a same height, and a bottom end of the first pin and a bottom end of the second pin have different heights.

10. The electrical connector assembly of claim 9, wherein the pins comprise a plurality of first pins and a plurality of second pins, the first pins are arranged in a plurality of first rows, the second pins are arranged in a plurality of second rows, and the first rows and the second rows are alternately provided.

11. The electrical connector assembly of claim 9, wherein the pins comprise a plurality of first pins and a plurality of second pins, and the first pins are surroundingly provided outside the second pins.

12. The electrical connector assembly of claim 11, wherein a length of each of the first pins is greater than a length of each of the second pins.

13. The electrical connector assembly of claim 8, wherein the base is provided with two opposite positioning portions and a through hole located between the two positioning portions, the positioning portions fit with the corresponding one of the accommodating holes to position each of the terminals, and when the one of pins is inserted downward to a final position, a bottom end of the one of the pins is lower than a top end of the through hole.

14. The electrical connector assembly of claim 8, wherein each of the pins is flat plate shaped, each of the contact arms is formed by extending along a straight line, and an inner surface of a free end of each of the contact arms forms an arc-shaped surface to be in contact with a plate surface of each of the pins.

15. An electrical connector assembly comprising:

a plug, having a plurality of pins, wherein the plug comprises a housing, the housing has a first surface and a second surface opposite to each other vertically, and a plurality of fixing grooves penetrating through the first surface and the second surface, the first surface is located above the second surface, the pins fit with and are fixed to the fixing grooves, a top end of each of the pins does not extend upward beyond the first surface, and the top end of each of the pins is downward concavely provided with a recess to accommodate a solder ball; and an electrical connector for the plug to insert downward therein, the electrical connector comprising:

a body, provided with a plurality of accommodating holes penetrating through an upper surface and a lower surface of the body, wherein each of the accommodating holes has two opposite shielding portions; and a plurality of terminals, correspondingly accommodated in the accommodating holes, each of the terminals comprising a base, two clamping arms extending from the base, and two clamping portions extending from the base, wherein an upper end of the base is exposed upward to a corresponding one of the accommodating holes, the two shielding portions are located above the two clamping arms and downward shield upper ends of the two clamping arms, one of the pins is inserted downward between the two clamping arms and clamped by the two clamping arms, and a solder is clamped by the two clamping portions.

16. The electrical connector assembly of claim 15, wherein the top end of each of the pins is flush with the first surface.

17. The electrical connector assembly of claim 15, wherein the housing is downward concavely provided with a plurality of grooves, each of the grooves is formed at one side of a corresponding one of the fixing grooves, each of the grooves is communicated with the corresponding one of the fixing grooves and configured to accommodate the solder ball, and each of a bottom surface of each of the grooves and a bottom surface of the recess has an arc-shaped surface matching with a shape of the solder ball.

18. The electrical connector assembly of claim 17, wherein the housing is downward concavely provided with a plurality of opening slots, each of the opening slots is formed at an opposite side of the corresponding one of the fixing grooves, each of the opening slots is communicated with the corresponding one of the fixing grooves, the opening slots do not penetrate downward through the second surface, and a depth of each of the opening slots is greater than a depth of the groove.

19. The electrical connector assembly of claim 15, wherein:

a receiving groove is provided between two adjacent ones of the accommodating holes for communication therebetween;

each of a left side and a right side of the base is provided with a positioning portion and a position limiting portion, and the positioning portion is located above the position limiting portion;

the positioning portions fit with the corresponding one of the accommodating holes to position each of the terminals in a left-right direction;

for two adjacent terminals of the terminals, two adjacent position limiting portions of the two adjacent terminals are accommodated in the same receiving groove; and the receiving groove has two position limiting surfaces opposite in a front-rear direction to limit the position limiting portion in the front-rear direction.

20. The electrical connector assembly of claim 15, wherein the base is provided with two opposite positioning portions and a through hole located between the two positioning portions, the positioning portions fit with the corresponding one of the accommodating holes to position each of the terminals, and when the one of pins is inserted downward to a final position, a bottom end of the one of the pins is lower than a top end of the through hole.

* * * * *